(12) United States Patent
Robinson et al.

(10) Patent No.: US 9,182,436 B1
(45) Date of Patent: Nov. 10, 2015

(54) PASSIVE ABSOLUTE AGE AND TEMPERATURE HISTORY SENSOR

(71) Applicant: Sandia Corporation, Albuquerque, NM (US)

(72) Inventors: Alex Robinson, Albuquerque, NM (US); Paul T. Vianco, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 346 days.

(21) Appl. No.: 13/711,457

(22) Filed: Dec. 11, 2012

Related U.S. Application Data

(60) Provisional application No. 61/583,429, filed on Jan. 5, 2012.

(51) Int. Cl.
| | | |
|---|---|---|
| *G01K 1/00* | (2006.01) | |
| *G01K 3/00* | (2006.01) | |
| *G01K 1/02* | (2006.01) | |
| *G01R 31/00* | (2006.01) | |

(52) U.S. Cl.
CPC ..................................... *G01R 31/00* (2013.01)

(58) Field of Classification Search
CPC ...................................................... G01R 31/00
USPC ........... 374/100–106, 137, 141, 170, 45, 130; 116/216, 217
See application file for complete search history.

(56) References Cited

U.S. PATENT DOCUMENTS

| | | | |
|---|---|---|---|
| 4,278,508 A | 7/1981 | White et al. | |
| 4,874,500 A | 10/1989 | Madou et al. | |
| 5,148,126 A | 9/1992 | Spencer | |
| 5,286,357 A | 2/1994 | Smart et al. | |
| 5,310,471 A | 5/1994 | Markle et al. | |
| 5,469,070 A | 11/1995 | Koluvek | |
| 5,498,914 A | 3/1996 | De Boer | |
| 5,854,557 A | 12/1998 | Tiefnig | |
| 5,959,457 A | 9/1999 | Berberich | |
| 5,972,198 A | 10/1999 | Takeuchi et al. | |
| 6,132,593 A | 10/2000 | Tan | |
| 6,616,332 B1 * | 9/2003 | Renken et al. | 374/162 |
| 6,706,091 B1 | 3/2004 | Robinson et al. | |
| 6,768,318 B2 | 7/2004 | Burt et al. | |
| 6,849,168 B2 | 2/2005 | Madou et al. | |

(Continued)

OTHER PUBLICATIONS

U.S. Appl. No. 11/168,246, filed Jun. 27, 2005, Simonson et al.

(Continued)

*Primary Examiner* — Melissa Koval
*Assistant Examiner* — Farhana Hoque
(74) *Attorney, Agent, or Firm* — Helen S. Baca

(57) ABSTRACT

A passive sensor for historic age and temperature sensing, including a first member formed of a first material, the first material being either a metal or a semiconductor material and a second member formed of a second material, the second material being either a metal or a semiconductor material. A surface of the second member is in contact with a surface of the first member such that, over time, the second material of the second member diffuses into the first material of the first member. The rate of diffusion for the second material to diffuse into the first material depends on a temperature of the passive sensor. One of the electrical conductance, the electrical capacitance, the electrical inductance, the optical transmission, the optical reflectance, or the crystalline structure of the passive sensor depends on the amount of the second material that has diffused into the first member.

12 Claims, 3 Drawing Sheets

(56) References Cited

U.S. PATENT DOCUMENTS

| | | |
|---|---|---|
| 6,897,669 B2 | 5/2005 | Ishio et al. |
| 7,082,824 B2 | 8/2006 | Lull |
| 7,708,943 B1 | 5/2010 | Robinson et al. |
| 7,913,534 B1 | 3/2011 | Robinson et al. |
| 8,267,576 B2 * | 9/2012 | Haarer et al. .................. 374/102 |
| 8,904,850 B1 | 12/2014 | Allendorf et al. |
| 2005/0269213 A1 | 12/2005 | Steimle et al. |
| 2007/0163892 A1 | 7/2007 | Haridas |
| 2009/0050049 A1 * | 2/2009 | Craig et al. ................... 116/217 |
| 2010/0001803 A1 | 1/2010 | Ramirez Munoz |
| 2013/0043892 A1 | 2/2013 | Tu et al. |

OTHER PUBLICATIONS

U.S. Appl. No. 11/934,996, filed Nov. 5, 2007, Mowry et al.
U.S. Appl. No. 13/253,274, filed Oct. 5, 2011, Allendorf et al.
U.S. Appl. No. 13/633,772, filed Oct. 2, 2012, Allendorf et al.
U.S. Appl. No. 13/711,457, filed Dec. 11, 2012, Robinson et al.
U.S. Appl. No. 14/056,863, filed Oct. 17, 2013, Okandan et al.
U.S. Appl. No. 14/102,422, filed Dec. 10, 2013, Derzon et al.
U.S. Appl. No. 14/312,472, filed Jun. 23, 2014, Robinson et al.
Sandia National Laboratories, "PC board mountable corrosion sensors," Sandia No. SAND-2013-8592P, Oct. 2013 (2 pages).

* cited by examiner

PASSIVE ABSOLUTE AGE AND TEMPERATURE HISTORY SENSOR

CROSS-REFERENCE TO RELATED APPLICATION

This application claims the benefit of U.S. Provisional Application Ser. No. 61/583,429 filed Jan. 5, 2012, which is incorporated herein by reference.

STATEMENT OF GOVERNMENT INTEREST

This invention was developed under Contract DE-AC04-94AL85000 between Sandia Corporation and the U.S. Department of Energy. The U.S. Government has certain rights in this invention.

TECHNICAL FIELD

The present invention is directed generally to passive absolute age and temperature history sensors, and, more particularly, to passive absolute age and temperature history sensors based on evolution over time of material properties.

BACKGROUND OF THE INVENTION

In many fields it is often desirable to know the absolute age and/or temperature history of a device or system starting from the time it is assembled or commissioned without the use of power during the aging period. Often, passive aging of a device or system may be required, which may exclude reliance upon digital or other powered clocks.

As a solution to this challenge, exemplary passive sensors based on physical materials system solutions are described here to meet this need. Some of these exemplary passive sensors may be used to understand the lifetime environment of the parent system (e.g. battery, cell phone, military system, etc.). For commercial applications, exemplary passive sensors according to the present invention may be used to verify or refute warranty claims.

SUMMARY OF THE INVENTION

An exemplary embodiment of the present invention is a passive sensor or gauge for historic age and temperature sensing, including a first member formed of a first material, the first material being either a metal or a semiconductor material and a second member formed of a second material, the second material likewise being either a metal or a semiconductor material. The term "semiconductor" should be understood broadly as including semimetals, semi-insulators, and the like. The term "metal" should likewise be understood broadly as including metal and metallic alloys and the like. For convenience, the terms "source member" and "base member" will be used interchangeably with "first member" and "second member" in either order. In some embodiments, the source member will be formed as a thin layer on a facial surface of the base layer and will serve as a diffusion source for material diffusing into the base member. In general, however, the terms "source member" and "base member" should not be understood as so limited.

A surface of the second member is in contact with a surface of the first member so as to form a diffusive interface. As such, the second material of the second member diffuses over time into the first material of the first member. The rate of diffusion for the second material to diffuse into the first material depends on a temperature of the passive sensor. One of the electrical conductance, the electrical capacitance, the electrical inductance, the optical transmission, the optical reflectance, or the crystalline structure of the passive sensor depends on the amount of the second material that has diffused into the first member.

Another exemplary embodiment of the present invention is a passive sensor or gauge for historic age and temperature sensing, including a first sensor element and a second sensor element. Each of the sensor elements comprises a pair of dissimilar material members. That is, the first sensor element includes a first member formed of a first material, the first material being either a metal or a semiconductor material and a second member formed of a second material, the second material being either a metal or a semiconductor material; and the second sensor element includes a third member formed of a third material, the third material being either a metal or a semiconductor material and a fourth member formed of a fourth material, the fourth material being either a metal or a semiconductor material.

A surface of the second member is in contact with a surface of the first member to form a diffusive interface such that, over time, the second material of the second member diffuses into the first material of the first member, and a surface of the fourth member is in contact with a surface of the third member to form a diffusive interface such that, over time, the fourth material of the fourth member diffuses into the third material of the third member. The first sensor element rate of diffusion for the second material to diffuse into the first material depends on a temperature of the passive sensor, as does the second sensor element rate of diffusion for the fourth material to diffuse into the third material. The second sensor element rate of diffusion is greater than the first sensor element rate of diffusion. One of the electrical conductance, the electrical capacitance, the electrical inductance, the optical transmission, the optical reflectance, or the crystalline structure of the first sensor element depends on the amount of the second material that has diffused into the first member. This property (electrical conductance, electrical capacitance, electrical inductance, optical transmission, optical reflectance, or crystalline structure) of the second sensor element depends on the amount of the fourth material that has diffused into the third member.

Further embodiments include even more than two sensor elements. If the passive sensor includes more than one sensor element, it is desirable for the temperature dependent rates of diffusion for the materials in each sensor element to differ. These differing temperature dependent rates of diffusion may allow for determination of a more precise age and temperature history of the passive sensor.

It is to be understood that both the foregoing general description and the following detailed description are exemplary, but are not restrictive, of the invention.

DETAILED DESCRIPTION

Figure 1:
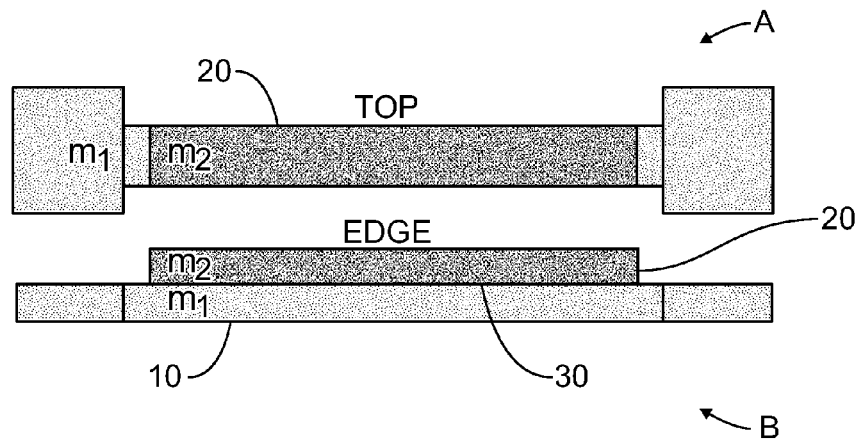
FIG. 1 provides a plan view and an elevational view of a sensor element in which members of different respective compositions share a diffusive interface

A passive sensor as provided here, also referred to here as a "gauge", provides an indication of absolute age and/or an indication of cumulative temperature history based on diffusion across an interface between dissimilar materials. That is, the sensor response depends on diffusion across a metal-semiconductor or metal-metal interface as a function of time and temperature. Under some circumstances, it will be possible to use two or more sensor elements that are similarly constructed but have different diffusive activation energies to determine the absolute age (from time of manufacture) independently of the temperature history, based on a mathematical model of the diffusion process.

The raw information to be used for inferring the age and temperature history is provided by measuring observable physical changes in the sensor elements due to diffusion. The diffusion may be unidirectional across the diffusive interface, or it may be bidirectional.

One typical observable physical change is a change in the electrical resistance or conductance of a sensor element. Any reference below to a measurement of electrical resistance should be understood as inclusive of equivalent measurements such as measurements of electrical conductance, and vice versa. At times, we will use the term "electrical conductive property" as inclusive of resistance, conductance, and the like.

Various physical mechanisms may underlie the observable changes in the electrical resistance of a sensor element consisting of a pair of dissimilar material members sharing a diffusive interface. Examples provided below of unidirectional diffusion from a source member into a base member are meant to be illustrative but not limiting. If, e.g., the source member is a thin film, it will become progressively thinner as it loses material by diffusion across the interface. As it becomes thinner, its contribution to the joint conductivity of the sensor element may progressively decrease. If the source member dominates the joint conductivity, then the joint conductivity will decrease as a consequence.

Diffusion of, e.g., metal atoms from a source layer into, e.g., a semiconductive base layer may increase the conductance of the base layer due to doping. Thus, in some arrangements the loss of material from the source layer might in fact increase the joint conductance. However, in more typical situations gains in the conductance of the base layer will not offset the loss of conductance of the source layer, and thus the net result will be an increase in the joint resistance.

Another possible physical change affecting resistance is volumetric change. That is, as one interdiffusing material becomes alloyed with or dissolved in another, the receiving material may expand or contract, leading to a change in its contribution to the joint conductance.

Another possible physical change affecting resistance is a change in the resistivity of the alloy or solution relative to the pure material, i.e., the material in its initial state prior to any diffusion. This has been alluded to above in relation to the diffusion of metal into semiconductor, but may be pertinent as well to metal-into-metal diffusion and other such processes.

Another possible physical change affecting resistance is a phase change, such as a change in crystal structure or grain structure.

Other observable physical changes are optical in nature. For example, diffusion into a member may change its material composition in a manner that affects its optical transmission or reflection spectrum, or its transmissivity or reflectivity at a particular wavelength or over a particular spectral range. Such changes may be observable using optical detectors, or they may lead to visually observable changes such as changes in color or in visual contrast. Moreover, a member disposed as, e.g., an interference layer may present a particular color on visual inspection prior to any diffusion, but may present a different color, or no color at all, when it undergoes changes in thickness due to diffusion.

Accordingly, we turn now to FIG. 1, which provides a plan view A and an elevational view B of a sensor element in which members 10 and 20, of respective compositions m1 and m2, share a diffusive interface 30. By way of example, compositions m1 and m2 are two metals with dissimilar conductivities, or alternatively, they are respectively a semiconductor (in this illustration provided as a substrate) and a metal. Thus, for example, m1 and m2 may be respectively gold and tungsten, or silicon and copper. (The silicon may be doped or undoped, depending on the initial conductive and electronic properties that are desired and on the changes in those properties that are desired as diffusion progresses.) Diffusion of at least m2 into m1 results in a change in, e.g., the joint conductance of the sensor element.

In various implementations, additional such sensor elements may be provided, either in separate packages or in a common package and even on a common substrate. As will be seen, arrays of two or more such sensor elements are useful, with the help of empirical data or a mathematical model, for isolating the age of the array from its thermal history.

In various implementations, the sensor element may be protected from attack by environmental agents by hermetically sealing it, encapsulating it in glass, applying a protective cap layer of e.g. a polymeric or inorganic dielectric material, or the like. Such protection may be useful against oxidation and other corrosive or degradative attack by environmental agents.

In use, the onset of measurable aging may be delayed by cooling the sensor. Various forms of cooling are known and need not be described in detail here. One possibility is to employ cryogenic cooling using, e.g., liquid nitrogen or even liquid helium.

Figure 2:
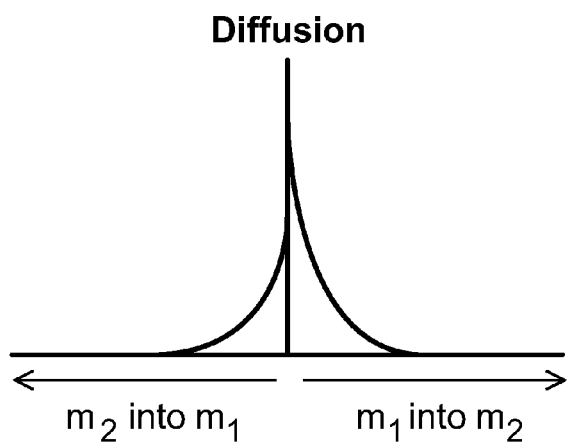
FIG. 2 is provided as a pedagogical illustration of Fickian interdiffusion across a diffusive interface.

Absent phase changes, the diffusion can generally be modeled to first order according to the well-known Fick's First and Second Laws. FIG. 2 provides a typical example of Fickian interdiffusion across a diffusive interface. With reference to FIG. 1, the vertical axis in FIG. 2 corresponds to interface 30, the region to the left of the vertical axis corresponds to member 10, and the region to the right of the vertical axis corresponds to member 20. Distance along the horizontal axis corresponds to distance from the interface into the respective member. Distance along the vertical axis corresponds to material concentration, with the maximum value being the native value (100% in pure materials) in the member that is the source of the diffusive species.

Figure 3:
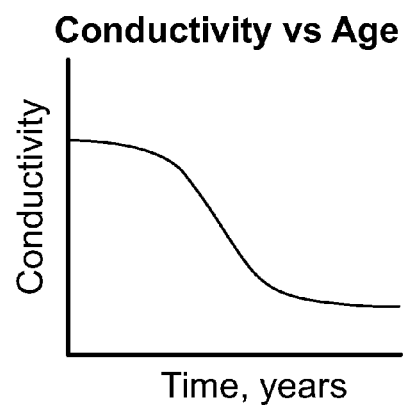
FIG. 3 provides a typical example of how the measured joint conductance of a sensor element as described herein may evolve over time.

FIG. 3 provides a typical example of how the measured joint conductance of a sensor element may evolve over time. For purposes of calibration, such relationships between conductance (or other electrical conductive property) and time may be provided in the form of a mathematical model or in the form of empirical data obtained from experimental tests and stored in, e.g., a data structure embodied in a computer-readable digital memory.

Fickian diffusion may be modeled, in a first-order estimate and assuming constant temperature as follows:

$$c(x, t) = c_o\left(\frac{x}{2\sqrt{Dt\pi}}\right)$$

c=concentration of m1 in m2 as a function of time t and distance x across the interface
$c_0$=initial concentration (100%)
D=diffusion coefficient for m1 into m2

The quantity $2\sqrt{DT}$ is referred to as the diffusion length.

The diffusion coefficient D may generally be approximated by
$D=D_0 e^{-RT/E_{act}}$
R=Rydberg's constant
T=temperature in Kelvin
$E_{act}$=activation energy of diffusive process
$D_0$=initial rate of diffusion It will be seen that the rate of diffusion is dependent on the ratio of the activation energy to the temperature. Hence, it will be advantageous to select material systems in view of the thermal ranges expected to be encountered during normal use. That is, material systems should be selected for activation energies that will lead to readily observable changes over the entire expected lifetime of the equipment whose age is to be gauged.

Several metal-metal systems known to change the joint resistance as interdiffusion progresses are, in order from highest to lowest rate of change: gold-copper, copper-tin, gold-titanium, and gold-nickel. These systems are identified here, by way of example but without limitation, as systems that will be useful in some practical implementations of the principles presented here. Of course numerous other material systems may likewise be useful in this context.

Material systems and dimensions are readily chosen to afford a lifetime of, e.g., 1, 2, 5, 10, 20, or 50 years under expected thermal conditions. For compatibility with typical lower power electronics, it is desirable to design the sensor element such that the joint resistance is greater than 1000 Ohms at all times during the sensor lifetime.

It will often be advantageous to package the sensor elements, or arrays of such elements, as surface-mountable elements. Those skilled in the art will appreciate that suitable such technology is well known, and may be used, for example, to provide packages measuring 0.180"×0.080", and even smaller packages measuring 0.080"×0.050". For example, a known surface-mountable corrosion sensor, which is readable via resistance measurements, employs a sensor element consisting of a copper trace. Such sensor element may be modified according to the principles described here by replacing the copper trace with a sensor element consisting of two dissimilar metals, or of a metal and a semiconductor, as discussed above. Such a design for a sensor element is represented in FIG. 4, to which attention is now directed.

In the figure, it will be seen that serpentine resistive trace 40 is the sensor element.

Trace 40 consists of, e.g., a gold-copper composite, or one of the other composite systems referred to above. As is well-known in the art, serpentine designs work well to increase the length of a trace while constrained with in a minimal footprint. Rounded shapes reduce charge concentration, which can lead to accelerated breakdown if sensors are frequently powered, as may happen, for example, during testing. The substrate footprint is often most efficiently utilized by rectangular serpentines.

Figure 4:
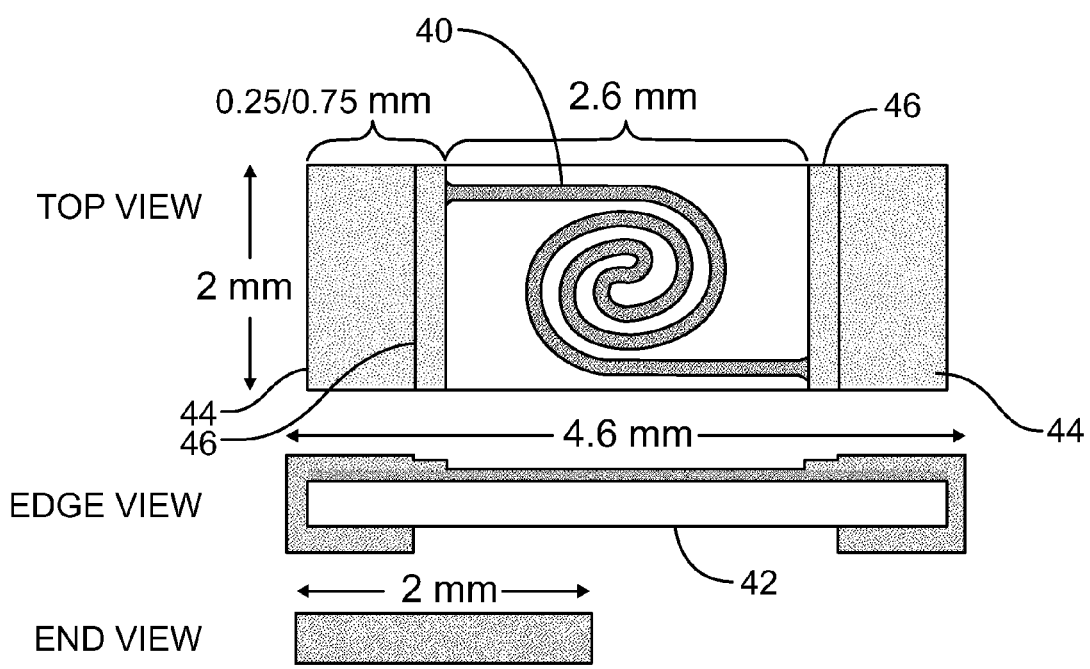
FIG. 4 provides a design for an exemplary surface-mountable sensor element.

With further reference to FIG. 4, it will be seen that a total footprint as small as 4.6 mm by 2 mm can be provided. The sensor assembly as shown includes a PC board 42, a pair of end caps 44 for soldering the PC board, and having the layer thicknesses and compositions 200/5000/500 Å Ti/Ni/Au. The assembly further includes, on each end, an oxidized nickel layer 46 as a solder barrier, and an adhesion layer (not shown) underlying sensor element 40.

As is well known, resistance can be controlled by controlling, in addition to the choice of materials, the metal trace thickness, width, and length.

Two metal traces in mutual contact can be roughly approximated as a pair of resistors connected in parallel, with joint resistance according to the well-known formula:

$$\frac{1}{R_{total}} = \frac{1}{R_{m1}} + \frac{1}{R_{m2}}$$

As the metals become fully mixed, the resistance approaches a new value, exemplarily a greater value, corresponding to the alloyed composition, as further modified by any crystalline forms that enhance or reduce conduction.

Illustratively, we have estimated the initial and final resistances of a sensor pair consisting of a pure gold trace and a pure titanium trace having the properties listed in the table below. The initial state is prior to any mixing, and the final state assumes complete mixing between the gold and the titanium:

| Metal | Resistivity, nOhms * m | trace width, um | trace length, mm | trace thickness, nm | Resistance, Ohms |
|---|---|---|---|---|---|
| gold | 22.14 | 5 | 158 | 500 | 1399 |
| titanium | 420 | 5 | 158 | 500 | 26544 |

The estimated initial and final joint resistances are shown in the table below:

| Sensor element modeled as: | Ohms |
|---|---|
| Parallel resistors (initial) | 1329 |
| Single resistor (final, fully mixed) | 6986 |

Figure 5:
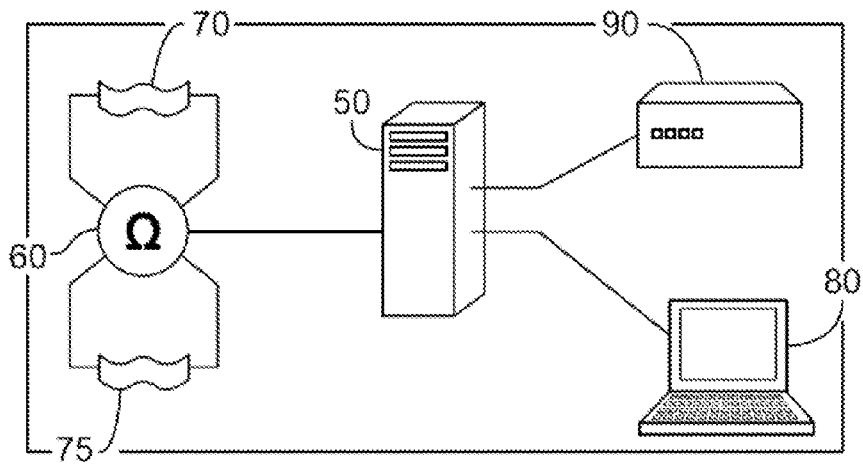
FIG. 5 provides a schematic view of an exemplary system in which a digital computing device obtains, from a measurement circuit, resistive measurements representing changes in the electrical resistance of two sensor pairs.

FIG. 5 provides a schematic view of a system in which a digital computing device 50 obtains resistive measurements from a measurement circuit 60, representing changes in the electrical resistance of sensor pairs 70 and 75. Device 50 interprets the measurements to infer the age of the sensor pairs and/or to infer a measure of the cumulative thermal history of the sensor pairs. In use, the sensor pairs will typically be attached to a piece of equipment, and hence in this manner the age or cumulative thermal history of the piece of equipment can be inferred. The result of the interpretation is displayed on display device 80. The interpretation may be made with the help of, e.g., a mathematical model or lookup table embodied in a data structure resident on digital memory device 90. The mathematical model or lookup table may include empirical data, obtained from calibration experiments, that relates various thermal histories to the observable resistance changes.

Some implementations will be useful using only a single sensor pair. For example, empirical data may be compiled relating resistance changes in the single pair to measures of cumulative thermal history, or empirical data may be compiled indicating one or more thresholds, such that if the resistance change exceeds that threshold, an expiration or other milestone is deemed to have occurred. However, when two or more sensor pairs are used, there may be sufficient independent information to separate an estimate of absolute age from the measure of cumulative thermal history. This can be seen, for example, from the following simple analysis, which will generally apply to first order when the diffusion obeys a Fickian model:

The diffusion length d for variable temperature T(t) is given by the following expression, where we substitute the above approximation for the temperature-dependent diffusion constant:

$$d(t) = 2\int_0^t D(t')\,dt' = 2D_0 \int_0^t \exp(-E_{act}/RT(t'))\,dt'$$

Using the well-known Taylor series expansion for $e^x$ and keeping terms only to first order, the above expression is approximated by:

$$d(t) \approx 2D_0 t - D_0 \int_0^t (E_{act}/RT(t'))\,dt'$$

It will be seen that the first term in the above expression is a measure of absolute age, whereas the second term is a measure of cumulative thermal history. Accordingly, by using two sensor pairs having different values of $E_{act}$ (and typically also different values of $D_0$), it will be possible to obtain separate solutions for t and for $$\int_0^t \frac{dt'}{T(t')},$$

provided that an estimate for d(t) can be obtained at the time of measurement. Because the diffusion length is a useful measure of the extent to which diffusion has taken place, we believe that to a useful approximation, it will often be possible to infer a value for d(t) from the observed resistivity changes.

It will be understood that if more than two sensor pairs are used, a larger system of algebraic equations, invoking further terms of the Taylor series, can be solved to provide even more accurate estimates of the age and cumulative thermal history.

It should be stressed in this regard that even under conditions where the Taylor-series approximation is unreliable, similar results will often be achievable using empirical calibration data.

In general, the various implementations of the principles described here will include structures adapted to facilitate the visual, optical, and/or electrical detection of diffusion across the diffusive interfaces of one or more sensor pairs. In the electrical implementations described above, such structures include, e.g., electrical conductor patterns for facilitating the resistive measurements. In other implementations, such structures may include any of various arrangements for the coupling of measuring light to a detector, wherein the measuring light is reflected from or transmitted through a sensor pair.

In yet other implementations, structures are included that facilitate visual detection. In implementations in which the sensor pairs undergo visually perceptible changes, one example of a structure that facilitates detection across a diffusive interface of a sensor pair is simply a further sensor pair, since detection may be conducted in such cases by visual comparison between different sensor pairs that have undergone different amounts of diffusion.

Figure 6:
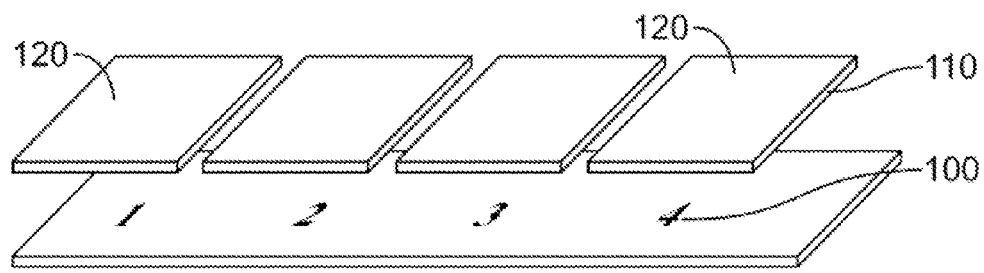
FIG. 6 provides a view of an exemplary arrangement in which a visual benchmark underlies a sequence of sensor pairs that sequentially change their appearance as diffusion progresses.

FIG. 6 provides another example, in which a visual benchmark 100, e.g. a legend or scale, underlies a sequence 110 of sensor pairs 120. As diffusion progresses, the respective sensor pairs sequentially change from transparent to opaque or from opaque to transparent, consequently revealing or obscuring the underlying visual pattern. Such an effect may be useful, for example in a pass/fail indicator, even if only a single sensor pair is used. Moreover, a single continuous sensor pair may take the place of a sequence of discrete sensor pairs if, e.g., a source layer is deposited as a wedge, i.e., with a thickness that changes, e.g. linearly, with longitudinal distance. As diffusion progresses, an increasingly long portion of the source layer may become fully mixed with an underlying base layer. The instantaneous state of such a system may be marked by a visual boundary between the fully mixed portion and the portion where there is remaining unmixed material in the source layer.

Figure 7:
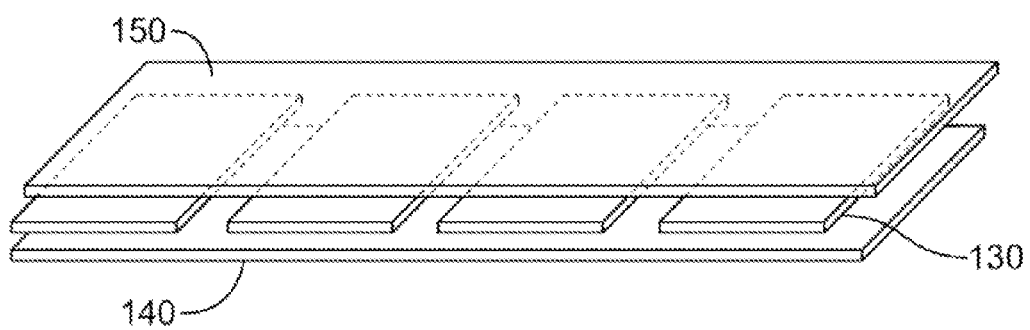
FIG. 7 provides a view of an exemplary arrangement in which visual detection of diffusion in a given sensor pair is facilitated by a patterned diffusion barrier layer.

FIG. 7 provides another example, in which visual detection of diffusion in a given sensor pair is facilitated by interposing a patterned diffusion barrier layer 130 between base layer 140 and source layer 150. The portions of the source layer that are in direct contact with the base layer are eventually mixed into the base layer, whereas those portions that overlie the barrier layer remain unmixed. Visual contrast between the mixed and unmixed portions renders visible the pattern embodied in the barrier layer and thus provides a visual benchmark.

Conversely, a patterned source layer overlying a contrasting base layer may undergo visible changes, such as the disappearance of words or other meaningful patterns, after sufficient diffusion has taken place.

What is claimed is:

1. A gauge for indicating age and/or thermal history of a piece of equipment, comprising:
    a base member formed of a first material and having a facial surface; and
    a source member formed of a second material distinct from the first material, disposed so as to form a diffusive interface with at least the facial surface of the base member;
    wherein:
        the gauge comprises at least one structure adapted to facilitate the visual, optical, and/or electrical detection of diffusion across the diffusive interface;
        the base and source members constitute a sensor pair that exhibits a visually perceptible response to at least a first thermal history;
        the gauge comprises at least one further such pair that exhibits a visually perceptible response to at least a second thermal history different from the first thermal history; and
        at least one said facilitative structure is a visual guide for determining whether any sensor pairs exhibit a visually perceptible response.

2. The gauge of claim 1, wherein the base and source members are formed as films deposited on a substrate.

3. The gauge of claim 1, wherein at least the second material is a metal.

4. The gauge of claim 3, wherein the first material is a semiconductor, the second material is a metal, and the facilitative structure is adapted to facilitate the detection of diffusion of the second material into the base member.

5. The gauge of claim 1, further comprising a cap layer disposed over the base and source members and having a composition effective for at least partially protecting the base and source members from attack by environmental agents.

6. The gauge of claim 1, wherein at least one said facilitative structure is an electric conductor pattern arranged to facilitate measurements of an electrical conductive property of the base and source layers.

7. The gauge of claim 1, wherein at least one said facilitative structure is a visual benchmark adapted to facilitate the detection of diffusion by providing visual contrast relative to the base and source members.

8. A gauge for indicating age and/or thermal history of a piece of equipment, comprising:
   a base member formed of a first material and having a facial surface; and
   a source member formed of a second material distinct from the first material, disposed so as to form a diffusive interface with at least the facial surface of the base member;
   wherein:
      the gauge comprises at least one structure adapted to facilitate the visual, optical, and/or electrical detection of diffusion across the diffusive interface;
      the base and source members constitute a sensor pair that belongs to an array of two or more such sensor pairs; and
      each sensor pair of the array has a respective characteristic diffusive response that depends on time and temperature and that is different from the characteristic diffusive responses of the other sensor pairs of the array.

9. The gauge of claim 8, wherein:
   each of said sensor pairs has an electrical conductive property that is responsive to diffusion across its respective diffusive interface;
   at least one said facilitative structure is situated in proximity to each sensor pair; and
   the facilitative structures collectively comprise a conductor pattern arranged to facilitate comparison of values of the electrical conductive property as respectively evaluated for each of the sensor pairs.

10. The gauge of claim 9, further comprising:
   a measurement circuit electrically connectable via the conductor pattern to each of the sensor pairs and adapted to generate a signal indicative of a change in value of the electrical conductive property for each respective sensor pair; and
   a digital computational device configured to receive said signals from the measurement circuit and in response thereto, to generate a signal indicative of an age of the sensor array.

11. The gauge of claim 10, wherein the digital computational device is further configured to generate, in response to the received signals, a signal indicative of a cumulative thermal history of the sensor array.

12. The gauge of claim 10, further comprising a digital memory embodying a data structure that relates values of the electrical conductive property to values of parameters that describe thermal history;
   and wherein the digital computational device is configured to generate the age-indicative signal further in response to values of said parameters retrieved from the digital memory.

\* \* \* \* \*